United States Patent
Tanaka et al.

(10) Patent No.: US 6,202,195 B1
(45) Date of Patent: Mar. 13, 2001

(54) SEMICONDUCTOR INTEGRATED CIRCUIT LAYOUT METHOD

(75) Inventors: Masakazu Tanaka; Masahiro Fukui; Noriko Shinomiya, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 08/898,562

(22) Filed: Jul. 22, 1997

(30) Foreign Application Priority Data

Jul. 26, 1996 (JP) .................................................. 8-197221

(51) Int. Cl.[7] .................................................. G06F 17/50
(52) U.S. Cl. .................................................. 716/13; 716/10
(58) Field of Search .................................. 364/488–491; 395/500.02–500.19; 716/1–21

(56) References Cited

U.S. PATENT DOCUMENTS

| | | | | |
|---|---|---|---|---|
| 5,510,999 | * | 4/1996 | Lee et al. .................................. | 716/5 |
| 5,515,291 | | 5/1996 | Omori et al. ............................. | 716/6 |
| 5,610,833 | * | 3/1997 | Chang et al. ............................ | 716/11 |
| 5,638,288 | * | 6/1997 | Deeley .................................... | 716/10 |
| 5,774,371 | * | 6/1998 | Kawakami .............................. | 716/10 |
| 5,787,268 | * | 7/1998 | Sugiyama et al. ....................... | 716/11 |
| 5,872,719 | * | 2/1999 | Miyazaki et al. ....................... | 716/12 |

FOREIGN PATENT DOCUMENTS

| | | | |
|---|---|---|---|
| 4-151853 | 5/1992 | (JP) ............................... | H01L/21/82 |
| 8-83847 | 3/1996 | (JP) ............................... | H01L/21/82 |

OTHER PUBLICATIONS

Dunlop et al. ("Chip Layout Optimization Using Critical Path Weighting", Paper 9–2, ACM/IEEE 21st Design Automation Conference, Jan. 1984, pp. 278–281).*

Menezes et al. ("Skew reduction in clock trees using wire width optimization", IEEE, Proceedings of IEEE Custom Integrated Circuits Conference–CICC '93, May 9, 1993, pp. 9.6.1–4).*

Saigo et al. ("Clock Skew Reduction Approach for Standard Cell," IEEE, Proc. on Custom Integrated Circuits Conference, May 1990, pp. 16.4/1–4).*

Pullela et al. ("Skew and Delay Optimization For Reliable Buffered Clock Trees", IEEE Comput. Soc. Press, Proceedings of 1993 International Conference on Computer Aided Design, Nov. 7, 1993, pp. 556–562).*

* cited by examiner

*Primary Examiner*—Matthew Smith
*Assistant Examiner*—Phallaka Kik
(74) *Attorney, Agent, or Firm*—McDermott, Will & Emery

(57) ABSTRACT

In designing a layout for a deep-submicron semiconductor integrated circuit, a violational wire involving a violation of the delay limitation is extracted based on information representing a layout result obtained in a layout step. In order to extend a wire spacing between such an extracted wire and its neighboring wire to above a predetermined wire spacing, the neighboring wire is subjected to parallel displacement. If such a parallel displacement causes a distance of separation between the parallelly-displaced wire and its neighboring component to fall below a predetermined distance of separation, the component in question is shifted in order of extending the separation distance. Accordingly, even if the delay time of wire is dominant in comparison with that of element in regard to the signal propagation delay time, violations of the delay limitation occurring when the signal propagation delay time is less than a predetermined delay time can be canceled by a less number of steps.

21 Claims, 20 Drawing Sheets

| Wire Name | Violated |
|-----------|----------|
| 1 | 3ns |
| ... | ... |

$C2 = d1/d2 \cdot C1$

Fig. 14

| Wire Name | Violated |
|-----------|----------|
| 1 | 3ns |
| ... | ... |

SEMICONDUCTOR INTEGRATED CIRCUIT LAYOUT METHOD

BACKGROUND OF THE INVENTION

The present invention relates to a method of laying out a semiconductor integrated circuit (SIC) with the aid of a computer. It more particularly pertains to an SIC layout technique for placing and interconnecting digital logic circuits or like components of a semiconductor integrated circuit.

In the design of large-scale integrated circuits (LSIs), it is required to meet limitations on the propagation delay time taken for a signal to propagate from one circuit to another and it is also very important to provide a semiconductor integrated circuit of minimum layout area, for the aspects of performance and costs. As the circuit scale of SIC increases the operating frequency thereof likewise increases. This results in an increase in the severity of a delay limitation imposed on the propagation delay time in a design phase. In an initial layout of a semiconductor integrated circuit, it is very important to modify the initial layout by reducing the signal propagation delay time of a wire involving a violation of the delay limitation, in order to cancel the delay limitation violation.

A conventional technique is discusses. When a layout is completed, the capacitance and resistance values of laid-out wires are exactly grasped and, based on the values, the signal propagation delay time of each wire is calculated. When a violation of the delay limitation is found, i.e., when any wire is found to have a signal propagation delay time in excess of a predetermined delay time, there are two ways of achieving a reduction of the signal propagation delay time. In the first way, a transistor in charge of driving a wire involving a violation of the delay limitation is replaced by another transistor having greater driving performance. In the second way, a violational wire is rerouted in order to reduce the length thereof.

The world of SIC enters now the deep-submicron age. As the cross-sectional area of wires is reduced, the resistance thereof increases. Additionally, the reduction of wire width and the reduction of wire spacing result in an increase in interwire capacitance (the capacitance between two adjacent wires), which therefore increases the total wire capacitance. Such increases in the total wire capacitance and in the wire resistance result in a longer signal propagation delay time. In regard to the signal propagation delay, wire delay becomes dominant in comparison with circuit component delay.

Accordingly, the foregoing conventional technique of making a change in the transistor driving performance may not be a very effective way of canceling violations of the delay limitation when wire delay becomes dominant.

For the case of rerouting a wire involving a violation of the delay limitation, it is also necessary to reroute its neighboring wires even when they are conformable to the delay limitation. Further, such rerouting may produce new violations of the delay limitation. Accordingly, the number of times such rerouting is carried out is increased. This is very time consuming. Much time is required to complete a design, and there is the possibility that repetition of the processing of rerouting will not make every wire free from a violation of the delay limitation.

SUMMARY OF THE INVENTION

Bearing in mind the above-described problems with the prior art techniques, the present invention was made.

Accordingly, it is an object of the present invention to provide an improved layout method for a semiconductor integrated circuit in cases where the delay of wires is dominant in comparison with the delay of elements in regard to the signal propagation delay. More specifically, in accordance with the present layout method, the resistance and capacitance of wire is reduced in order of effectively canceling violations of the wire delay limitations, and the number of process steps required for re-design can be reduced without having to perform a process of rerouting a wire to reduce the length thereof.

With a view to achieving the above-noted object, in the layout method of the present invention a layout is generated based on a predetermined design limitation imposed on the wiring such as wire spacing defined between wires and wire width. If there is found a violational wire involving a violation of the design limitation, then the severity of the design limitation is relaxed so as to cancel the violation.

The present invention provides a method for the layout of a semiconductor integrated circuit, said layout method comprising:

(a) a layout step of laying out, in conformance with a predetermined design limitation, wires for interconnecting components which together form a circuit;

(b) a delay judging step of checking, on the basis of information representing a layout result obtained in said layout step, each of said laid-out wires for the presence of a violation of a predetermined delay limitation for the limitation of a signal propagation delay time; and (c) a design limitation modifying step of making a change in said predetermined design limitation on the basis of said layout result information and a result of said judging step.

It is preferred in the layout method that the delay judging step includes a delay limitation violating wire extracting step of extracting, from among the laid-out wires, a violational wire in violation of the predetermined delay limitation, and the design limitation modifying step includes a delay limitation violation canceling step of making a change in the design limitation imposed on the violational wire in order to cancel the delay limitation violation.

It is preferred in the layout method that:

a wire spacing defined between two adjacent wires is predetermined to serve as the design limitation; and the delay limitation violation canceling step includes a wire spacing modifying step of subjecting a wire located next to the extracted wire in violation of the delay limitation to parallel displacement in order to extend a wire spacing defined between the violational wire and the neighboring wire to above the predetermined wire spacing.

It is preferred in the layout method that:

a wire width is predetermined to serve as the design limitation; and the delay limitation violation canceling step includes a wire width modifying step of extending, based on the layout result information and the information about the violational wire, the width of the violational wire and parallelly displacing the remaining other wires a distance equal to the widened width.

It is preferred in the layout method that:

the layout step lays out the wires on the basis of a predetermined design limitation with such allowance for most of the laid-out wires to meet the predetermined delay limitation;

the delay judging step includes an affording wire extracting step of extracting, from among the laid-out wires, an affording wire having a signal propagation delay time which meets the predetermined delay limitation; and the design limitation modifying step including:

a design limitation changing step of increasing the severity of the predetermined design limitation imposed on the extracted affording wire; and a compaction step of modifying, based on the revised design limitation, a layout around the affording wire in order to achieve a reduction in layout area.

It is preferred in the layout method that:

a wire spacing defined between two adjacent wires is predetermined to serve as the design limitation; and the compaction step includes a wire spacing modifying step of subjecting a wire located next to the extracted affording wire to parallel displacement in order to reduce a wire spacing defined between the affording wire and the neighboring wire to below the predetermined wire spacing.

It is preferred in the layout method that:

a wire width is predetermined to serve as the design limitation; and the compaction step includes a wire width modifying step of reducing the width of the affording wire and parallelly displacing the remaining other wires a distance equal to the reduced width.

The present invention provides a semiconductor integrated circuit comprising a plurality of components together forming a circuit which are connected together by wires, wherein:

if a design limitation imposed on a wire of said wires is identical to the one imposed on the remaining other wires, said wire is determined to be a violational wire in violation of a predetermined delay limitation imposed on the delay time required for a signal to propagate between components connected by said violational wire; and said design limitation of said wire is set to be different from said design limitation of said remaining other wires.

It is preferred in the semiconductor integrated circuit that:

a wire spacing defined between two adjacent wires is predetermined to serve as the design limitation; and a greater wire spacing than the predetermined wire spacing is set between the wire and its neighboring wire.

It is preferred in the semiconductor integrated circuit that:

a wire width is predetermined to serve as the design limitation; and the wire is set having a greater wire width than the predetermined wire width.

In accordance with the layout method of this invention, a layout of wires in conformance with a predetermined design limitation is generated. If there is found a violational wire involving a violation of the design limitation, then a change in the design limitation such as the width of the violational wire and the spacing between the violational wire and its adjacent wire is made, in other words the width of the violational wire or the spacing between the violational wires and its adjacent wire is increased to cancel the violation.

With the above-described layout technique, the resistance and capacitance of a wire in violation of the delay limitation decreases, and wire delay, which is dominant in comparison with element delay in regard to the signal propagation delay, is reduced thereby making it possible to effectively cancel the delay limitation violation.

An increase either in the wire width or in the wire spacing involves only parallel displacement of the other wires, which ensures that, in comparison with a prior art technique that reroutes a wire in order of reducing its length, the violation of the delay limitation can be canceled and re-designing requires a less number of process steps.

The severity of the design limitation is increased with respect to an affording wire which can afford to meet the delay limitation. If layout area compaction is performed while satisfying such a severe design limitation, this makes it possible to provide a further reduced layout area while preventing every wire from violating the design limitation.

A technique of extending the width of a wire involving a violation of the delay circuit may not be applied to semiconductor integrated circuits with a relatively wide wire spacing or with a relatively great wire lateral width. The reason is that the total capacitance of a wire is determined by the wire/substrate capacitance (the capacitance between the wire and a semiconductor substrate) in such a semiconductor integrated circuit. Accordingly, even when the resistance of a wire is reduced by extending the width thereof, the wire/substrate capacitance, i.e., the total capacitance, increases. The delay time cannot be reduced much. Conversely, in a semiconductor integrated circuit with a narrow wire spacing between wires or with a relatively narrow wire lateral width, the total wire capacitance is determined, almost by the interwire capacitance and the fringe capacitance between the wire side and the semiconductor substrate and, and the ratio of the wire/substrate capacitance to the total capacitance is low. Therefore, extending the wire width will not cause the total wire capacitance to increase much, and the wire resistance is decreased thereby further reducing the delay time.

BRIEF DESCRIPTION OF THE DRAWINGS

Preferred embodiments of the present invention are now illustrated with reference to the accompanying drawings in which:

FIG. 4 shows information about a wire involving a violation of the delay limitation;

FIG. 14 shows information about a wire involving a violation of the delay limitation;

DETAILED DESCRIPTION OF THE INVENTION

Preferred embodiments of the present invention are now described with reference to the accompanying drawing figures.

First Embodiment

Referring to FIGS. 1–7, a first preferred embodiment of this invention is illustrated.

Figure 1:
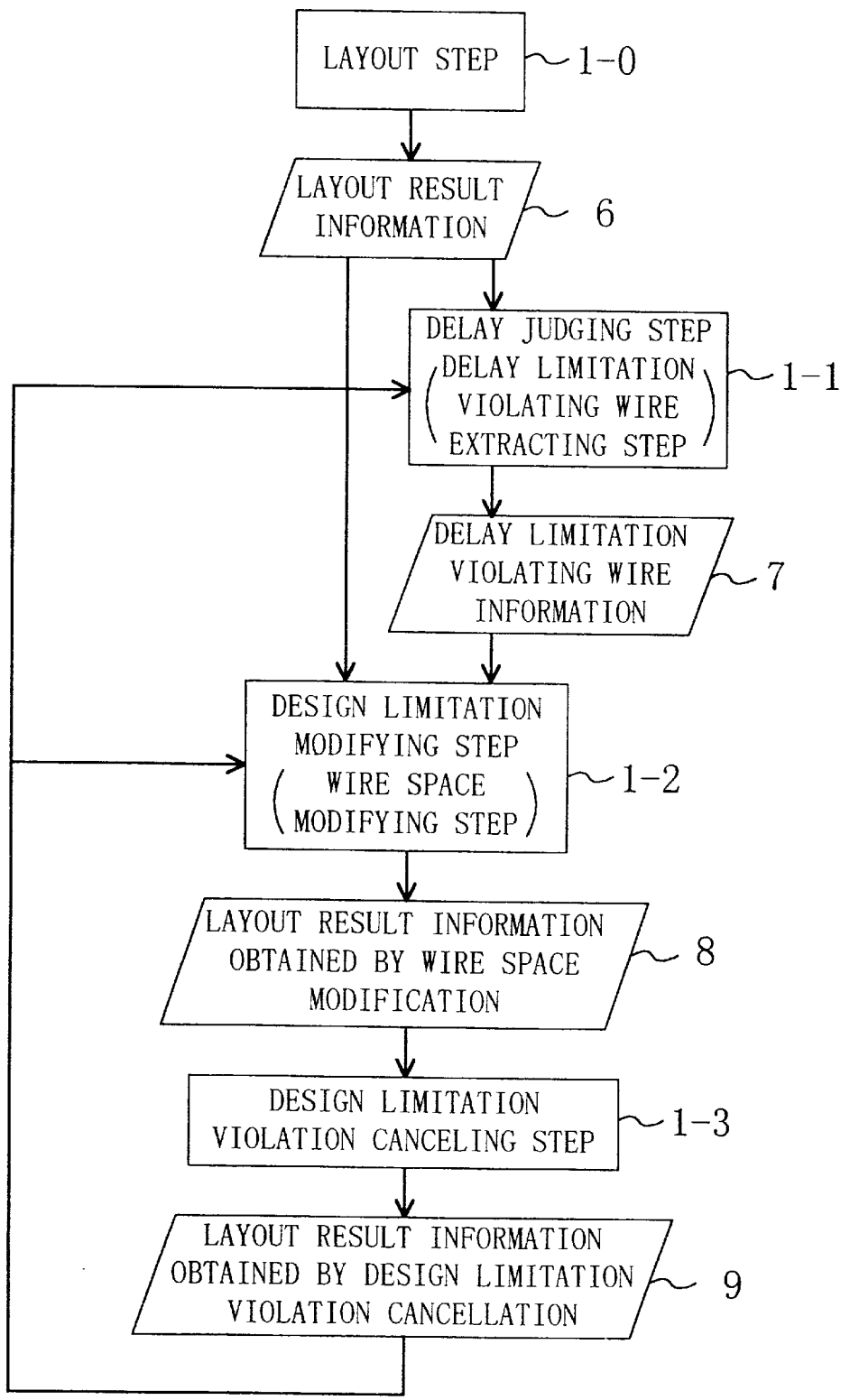
FIG. 1 is a diagram showing steps of a layout method in accordance with a first embodiment of the present invention.
Figure 2:
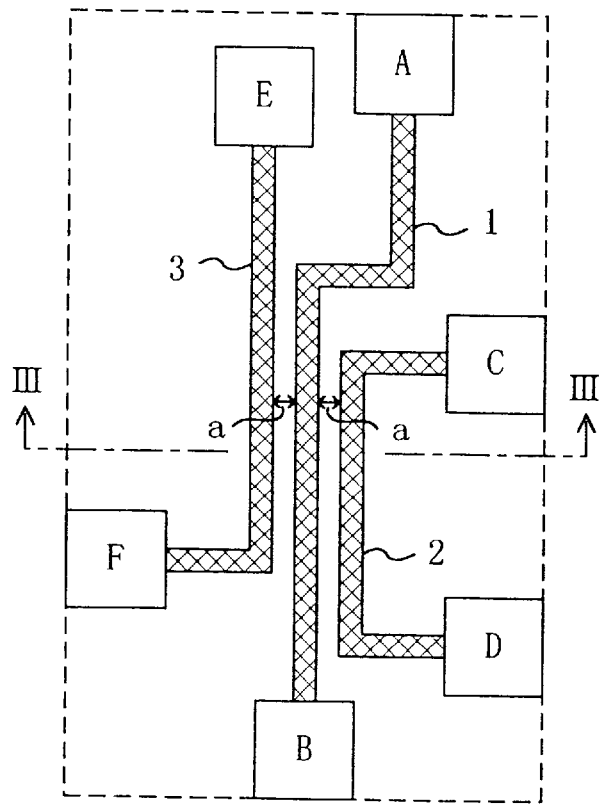
FIG. 2 shows a layout result obtained by a layout step of the layout method of the first embodiment.

FIG. 1 is a flow chart showing steps of a layout method according to the first embodiment. This flow chart is formed of a program. This program is an execution program for use in a wiring layout method which is executed by, for example, general-purpose computer, stored in a computer readable recording medium such as floppy disk, and fed to a computer which generates a layout of wires.

Step 1-0, a wiring layout step, is described. Components A–F, which together form a semiconductor integrated circuit, are placed. Wires 1-3, which connect together components, are laid out. In step 1-0, the wires 1-3 are laid out such that a wire spacing between two adjacent wires (i.e., the wires 1 and 2 and the wires 1 and 3) and a distance of separation between a specific component and a wire located next to the component meet predetermined design limitations, namely a predetermined wire spacing and a predetermined distance of separation, respectively. Information 6 representing a layout result of step 1-0 is obtained. In the present embodiment, the latter design limitation imposed on the distance of separation has a margin (allowance).

Accordingly, even when the wire 2 is moved towards the components C and D or even when the wire 3 is moved towards the component F, a resulting distance of separation will sufficiently conform with the design limitation.

Figure 3:
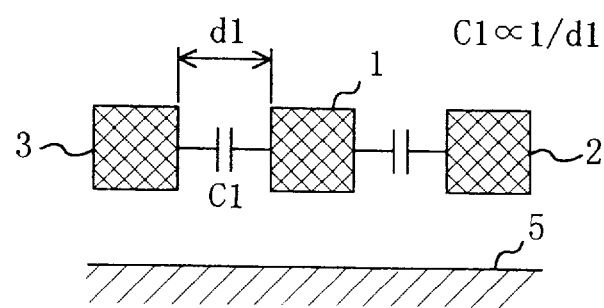
FIG. 3 shows a model diagram showing, in cross section taken along lines III—III of FIG. 2, the layout result shown in FIG. 2.

Step 1-1, a delay judging step 1-1, is described. Based on the information 6 obtained in step 1-0, a propagation delay time, required for a signal to propagate between two components connected by each wire 1-3, is calculated in step 1-1, and a predetermined delay limitation for the limitation of the signal propagation delay time of each wire 1-3 is obtained from memory or the like. Thereafter, each of the calculated signal propagation delay times is compared with the predetermined delay time, in order to determine whether a laid-out wire is in violation of the predetermined delay time. In other words any wire with a longer signal propagation delay time than the predetermined signal propagation delay time, is extracted. FIG. 3 is a cross-sectional view of FIG. 2 taken along lines III—III thereof. Both a spacing d1 between the wires 1 and 3 and an interwire capacitance C1 between the wires 1 and 3 are taken into account, and the signal propagation delay time for each of the wires 1-3 is calculated from the wire's 1 layout form including the relationship that C1 is in proportion to 1/d1. The same can be applied to the wires 1 and 2. 5 is a semiconductor substrate.

Figure 4:
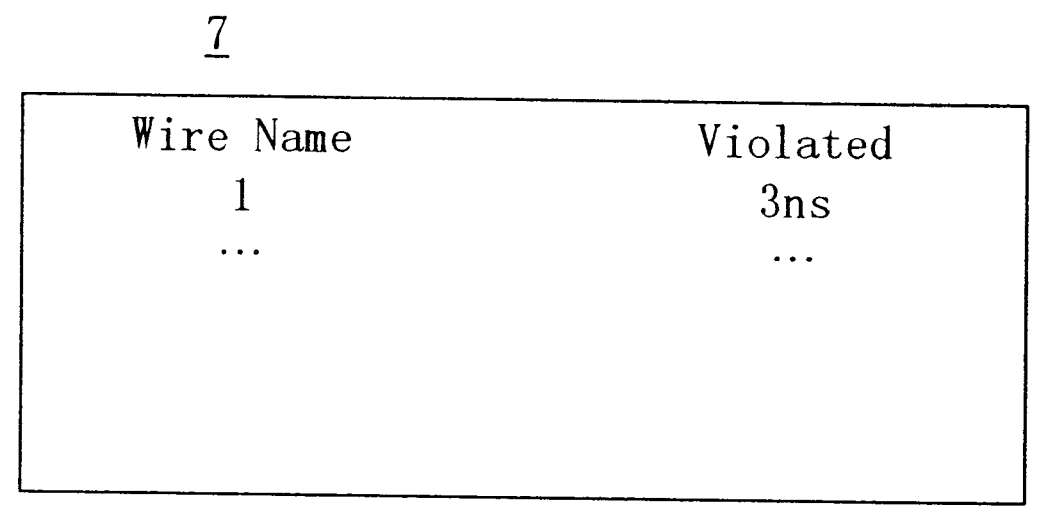

Information 7 about a violational wire involving a violation of the delay limitation is obtained in step 1-1. FIG. 4 shows the information 7. The information 7 informs that the signal propagation delay time of the wire 1 is 3 nanoseconds, in other words a timing error is occurring in the wire 1.

Step 1-2 is a design limitation modifying step formed of a wire spacing modifying step (a delay limitation violation canceling step). On the basis of the information 6 and 7, a change in the predetermined design limitation is made in order to extend a wire space defined between the extracted wire in violation of the delay limitation and its neighboring wire. Based on the change, the neighboring wire is subjected to parallel displacement in order to extend the foregoing wire spacing.

Step 1-3 is a design limitation violation canceling step. Layout information 8 representing a result of the wire spacing modifying process of step 1-2 is entered in step 1-3. When a distance of separation between the parallelly displaced wire and its adjacent component, is less than a predetermined distance of separation, in other word when the component is in violation of the design limitation, such a violational component is moved in order to broaden the separation distance on the basis of the layout information 8 in order to cancel the violation. Layout information 9 representing a result of step 1-3 is obtained.

Figure 5:
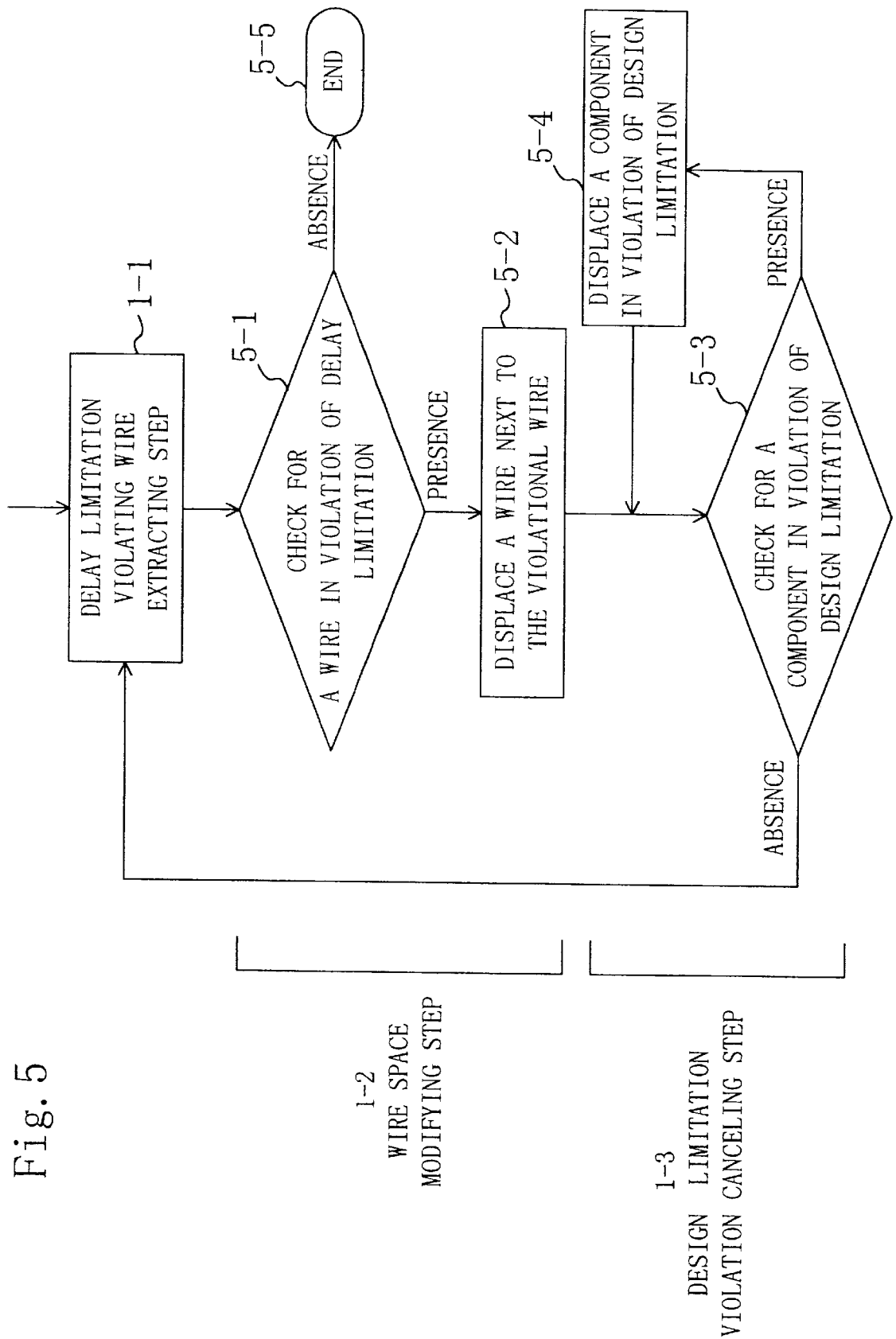
FIG. 5 is a diagram showing in detail a step of modifying a wire spacing defined between wires and a step of canceling a violation of the design limitation in the first embodiment.

The steps 1-2 and 1-3 are described in detail by reference to FIG. 5. In step 5-1, the information 7 generated in step 1-1 is entered and, based on the information 7, a check is made for the presence or absence of a wire involving a violation of the delay limitation.

In the presence of a wire in violation of the delay limitation, a wire spacing defined between such a violational wire and its adjacent wire is made broader than the foregoing predetermined wire spacing a by means of parallel displacement of the adjacent wire. The amount of parallel displacement can be found by calculating a capacitance between wires from a signal propagation delay value. In the event that the wire 1 is in violation of the delay limitation, the wire 2, located next to the violational wire 1, is parallelly displaced towards the components C and D and the other adjacent wire 3 is parallelly displaced towards the component F.

Figure 6:
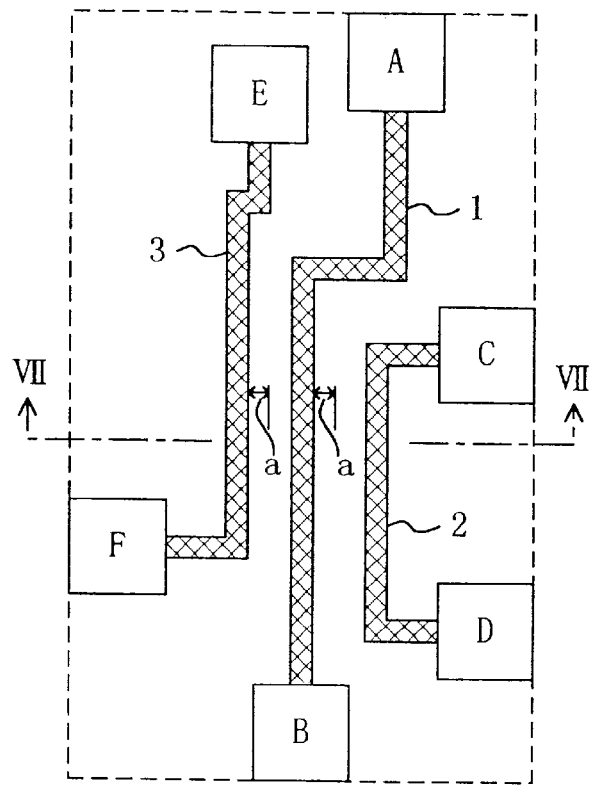
FIG. 6 is a diagram showing a final layout result obtained by the wire spacing modifying (extending) step of the first embodiment.

Next, in step 5-3, a check is made to determine whether a violation of the design limitation takes place, in other words a check is made to determine whether a distance of separation, defined between the parallelly displaced wire and a component located next to the parallelly displaced wire, is less than a predetermined distance of separation. Referring to FIG. 6, both a distance of separation defined between the wire 1 and each of the components C and D and a distance of separation defined between the wire 3 and the component F exceed the predetermined distance of separation, therefore meeting the design limitation. The layout program returns to step 5-1 accordingly.

In the presence of a component involving a violation of the design limitation (a violation of the distance of separation from the adjacent wire), such a violational component is parallelly displaced so as to increase the distance of separation from the adjacent wire to above the predetermined separation distance, in order to meet the design limitation.

The layout program returns to step 5-1 when the parallel displacement of the violational component cancels the design limitation violation, and a check is made to determine whether the wire, subjected to parallel displacement in step 5-2, becomes a violational wire involving a violation of the delay limitation. In the presence of such a new violational wire, the layout program proceed to steps following step 5-1. On the other hand, in the absence of a new violational wire, the layout program proceeds to step 5-5 and the layout processing is completed.

Figure 7:
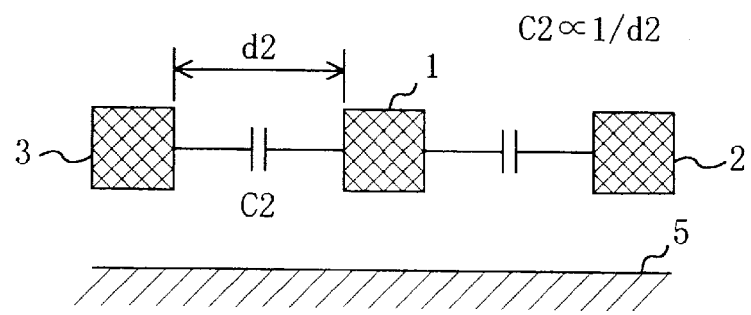
FIG. 7 shows a model diagram showing, in cross section taken along lines VII—VII of FIG. 6, the final layout result shown in FIG. 6.

FIG. 7 is a model diagram showing a cross-sectional view of a layout of the post-parallel displacement wires of FIG. 6 taken along lines VII—VII thereof. Elements of FIG. 6 and their corresponding elements of FIG. 3 are assigned the same reference numerals. The spacing between the wire 1 and the wire 3 is extended from d1 to d2. Since the interwire capacitance between the wire 1 and the wire 3, C2, is in proportion to 1/d2, C2 for d2 is smaller than C1 for d1 (see FIG. 3). In other words, if C1 and d1 of FIG. 3 are used, then C2/C1=d1/d2. Therefore, C2 decreases by a proportional amount to the extension of the spacing between the wires 1 and 3 from d1 to d2.

In accordance with the present embodiment, it is arranged such that there is a margin for the design limitation. Accordingly, even when the wires 2 and 3 are parallelly displaced, the wire 2 and the component C (or D) are separated apart from each other a distance of separation more than the predetermined distance of separation and the wire 3 and the component F are also separated apart from each other more than the predetermined separation distance. As can be seen by making a comparison between FIG. 2 and FIG. 6, the violation of the delay limitation can be cancelled without suffering an increase in the layout area.

Figure 8:
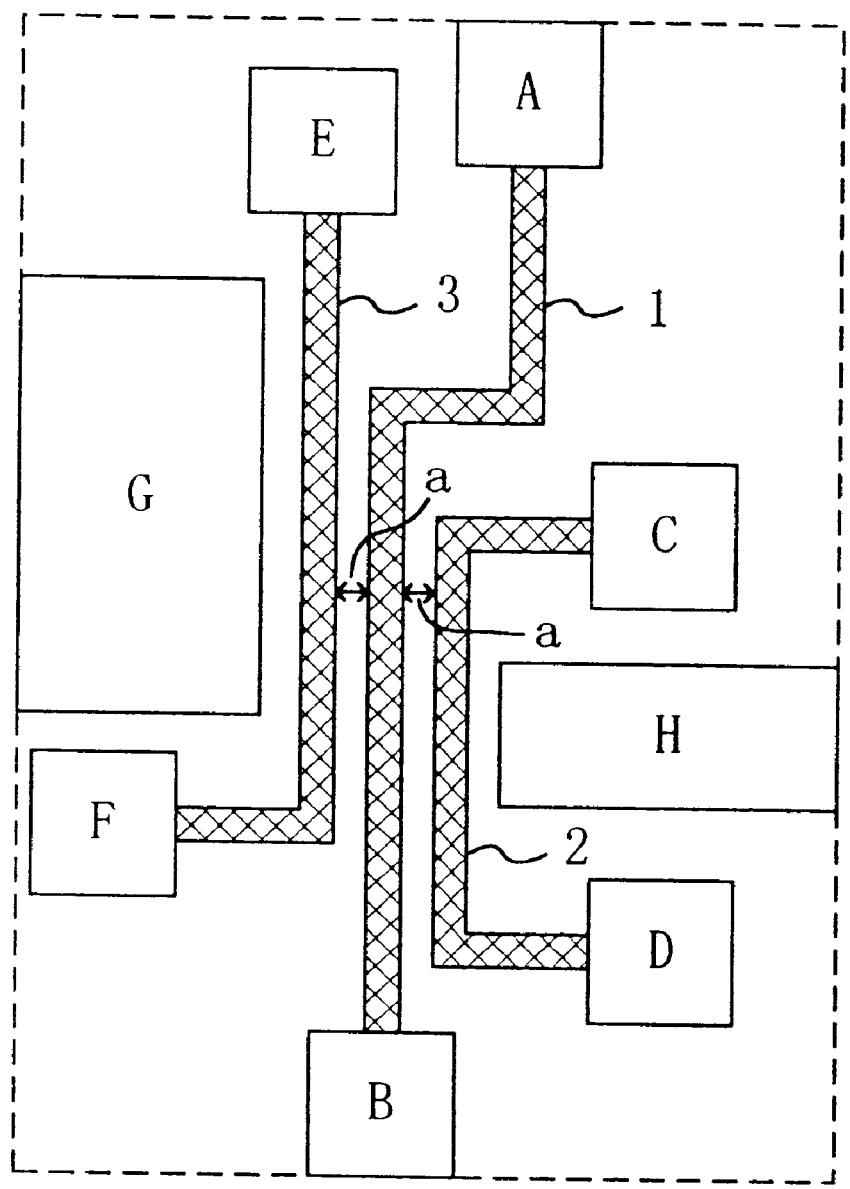
FIG. 8 is a diagram showing a layout result obtained by a layout step of a modification of the first embodiment.
Figure 9:
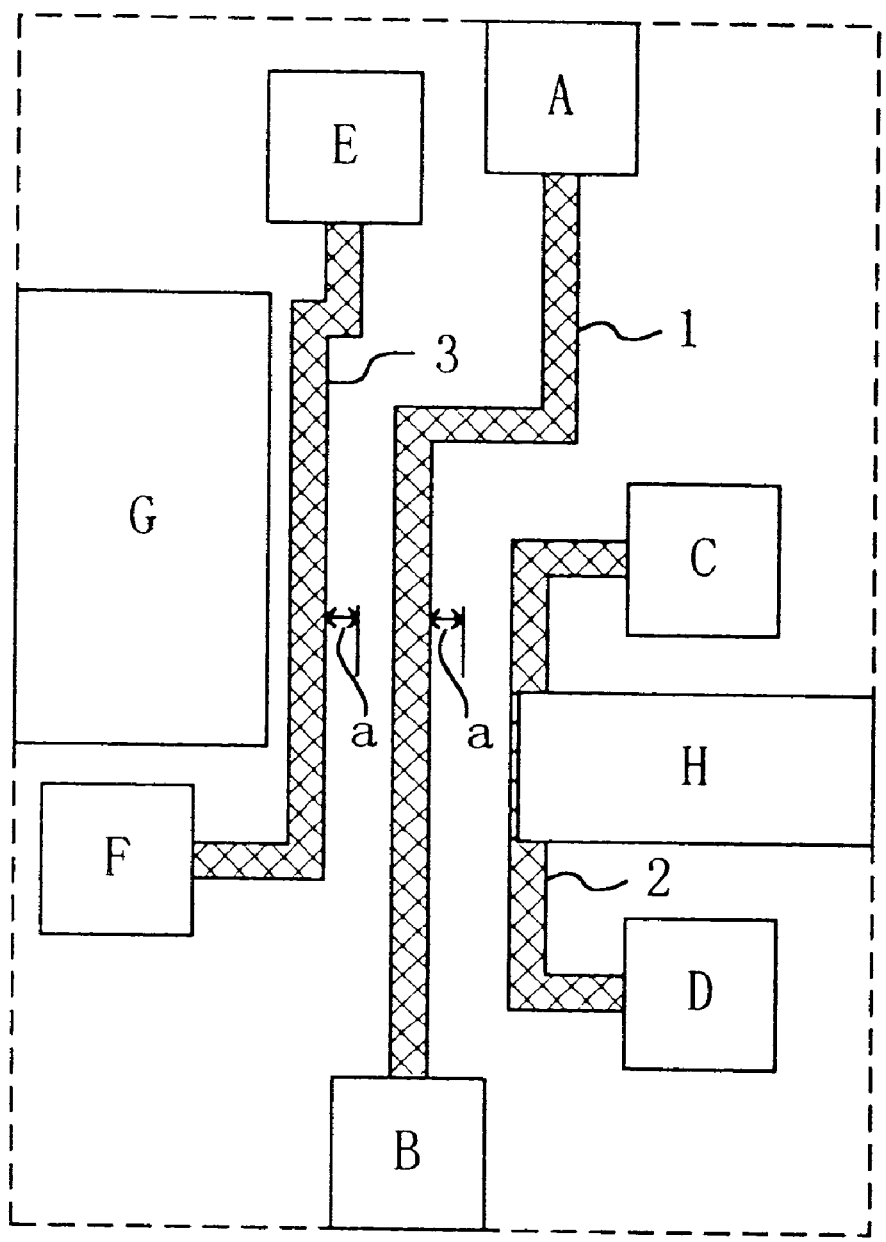
FIG. 9 is a diagram showing a layout result obtained by a wire spacing modifying (extending) step of the modification of the first embodiment.
Figure 10:
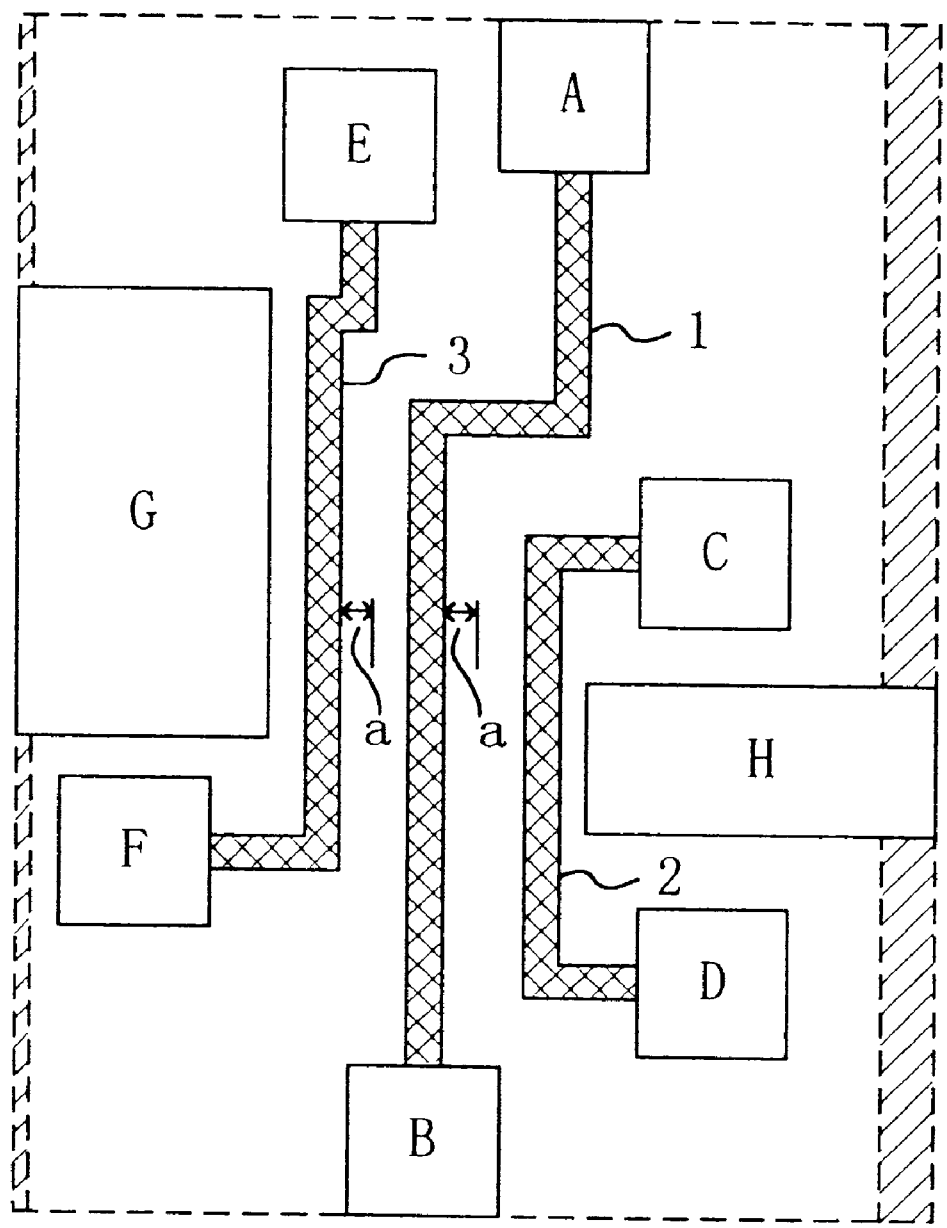
FIG. 10 is a diagram showing a final layout result obtained by displacing a component involving a violation of the design limitation in the modification of the first embodiment.

Referring now to FIGS. 8–10, a modification of the first embodiment is described.

Referring first to FIG. 8, information representing a layout result is shown. In accordance with the present modification, there is provided no margin for the design limitation, and FIG. 8 shows a layout of minimum area enclosed by broken line. Accordingly, in the event that the spacing between wires is extended an increase in the layout area is taken into account.

Referring still to FIG. 8, A–H are components together forming a semiconductor integrated circuit. 1-3 are wires. More specifically, the wire 1 connects together the components A and B. The wire 2 connects together the components C and D. The wire 3 connects together the components E and F.

If the wire 1 involves a violation of the delay limitation, in other words, the signal propagation delay time of the wire 1 (i.e., the time required for a signal to travel from the component A to the component B through the wire 1) exceeds a predetermined delay time, then the wires 2 and 3 are subjected to a right shift and to a left shift (see FIG. 9), respectively, as in the first embodiment, in order to provide a greater wire spacing between the wires 1 and 2 and between the wires 1 and 3 than the predetermined wire spacing a. This causes violations of the design limitation. More specifically, both the distance of separation of the component H from the wire 2 and the distance of separation of the component G from the wire 3 are less than the predetermined distance of separation.

Next, in step 1-3 (the design limitation violation canceling step) of FIG. 1, the violational component G is left-shifted and the violational component H is right-shifted in order of canceling the violations of the design limitation. FIG. 10 shows information representing a layout result produced by such cancellations.

In the layout method of the present modification, there is an increase in the layout area (see hatched areas in FIG. 10) from the layout area enclosed by broken line of FIG. 8.

Second Embodiment

A second preferred embodiment of the present invention is described by making reference to FIGS. 11–17.

Figure 11:
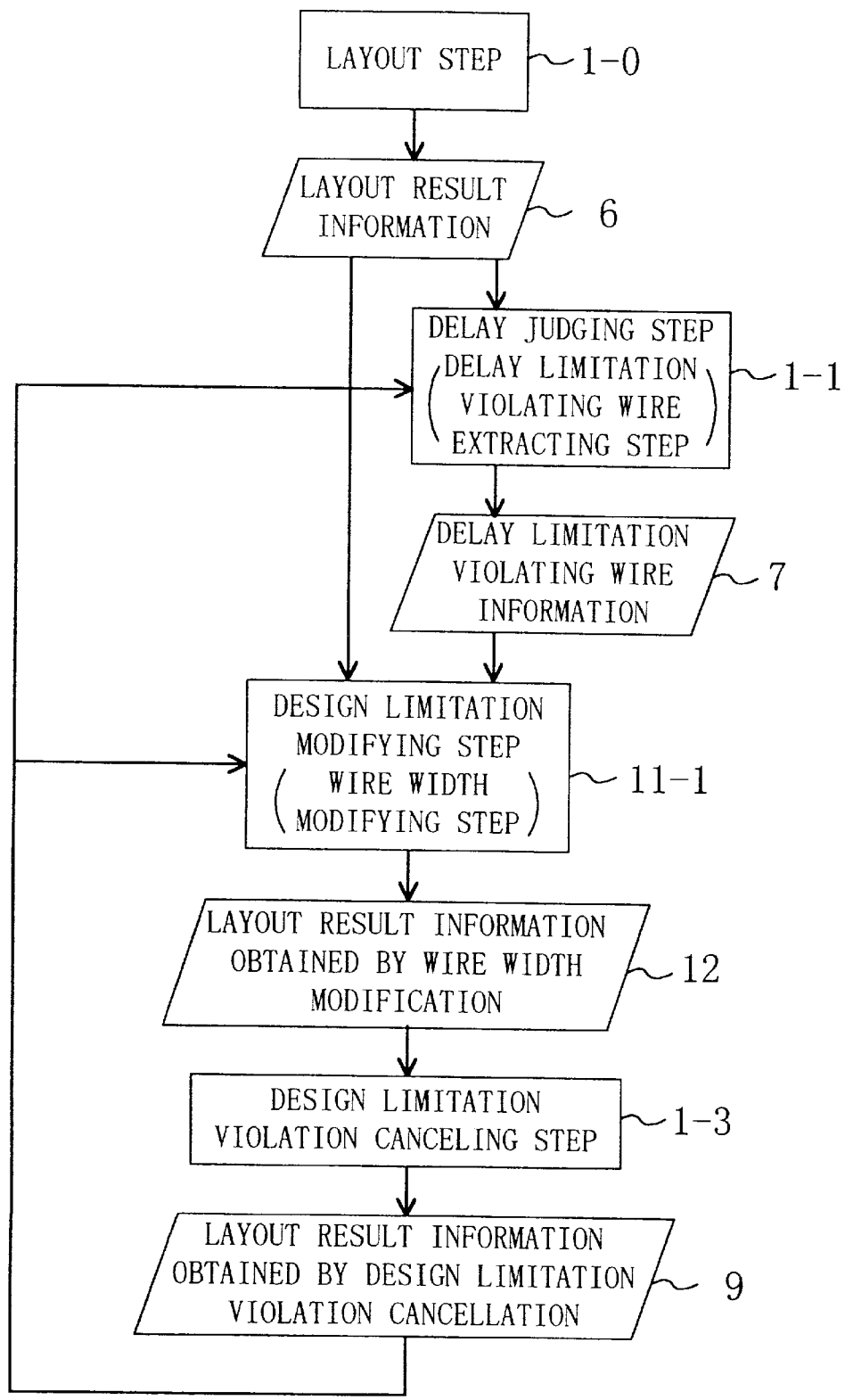
FIG. 11 is a diagram showing steps of a layout method in accordance with a second embodiment of the present invention.

Referring first to FIG. 11, a flow of steps of a layout method of the second embodiment is illustrated. This flow chart is formed of a program. This program is an execution program for use in a wiring layout method which is executed by, for example, general-purpose computer and stored in a computer readable recording medium such as floppy disk.

Only different steps from FIG. 1 are explained and like steps are assigned like step numbers.

Step 11-1 is a design limitation modifying step formed of a wire width modifying step (i.e., a delay limitation violation canceling step). In step 11-1, a change in the predetermined design limitation is made in order to extend the width of a wire involving a violation of the delay limitation on the basis of the information 6 and 7. Based on the change made, the width of the violational wire is widened, and the remaining other wires are parallelly displaced for a distance corresponding to the widened width. Information 12, which represents a layout result of step 11-1, is obtained.

Figure 15:
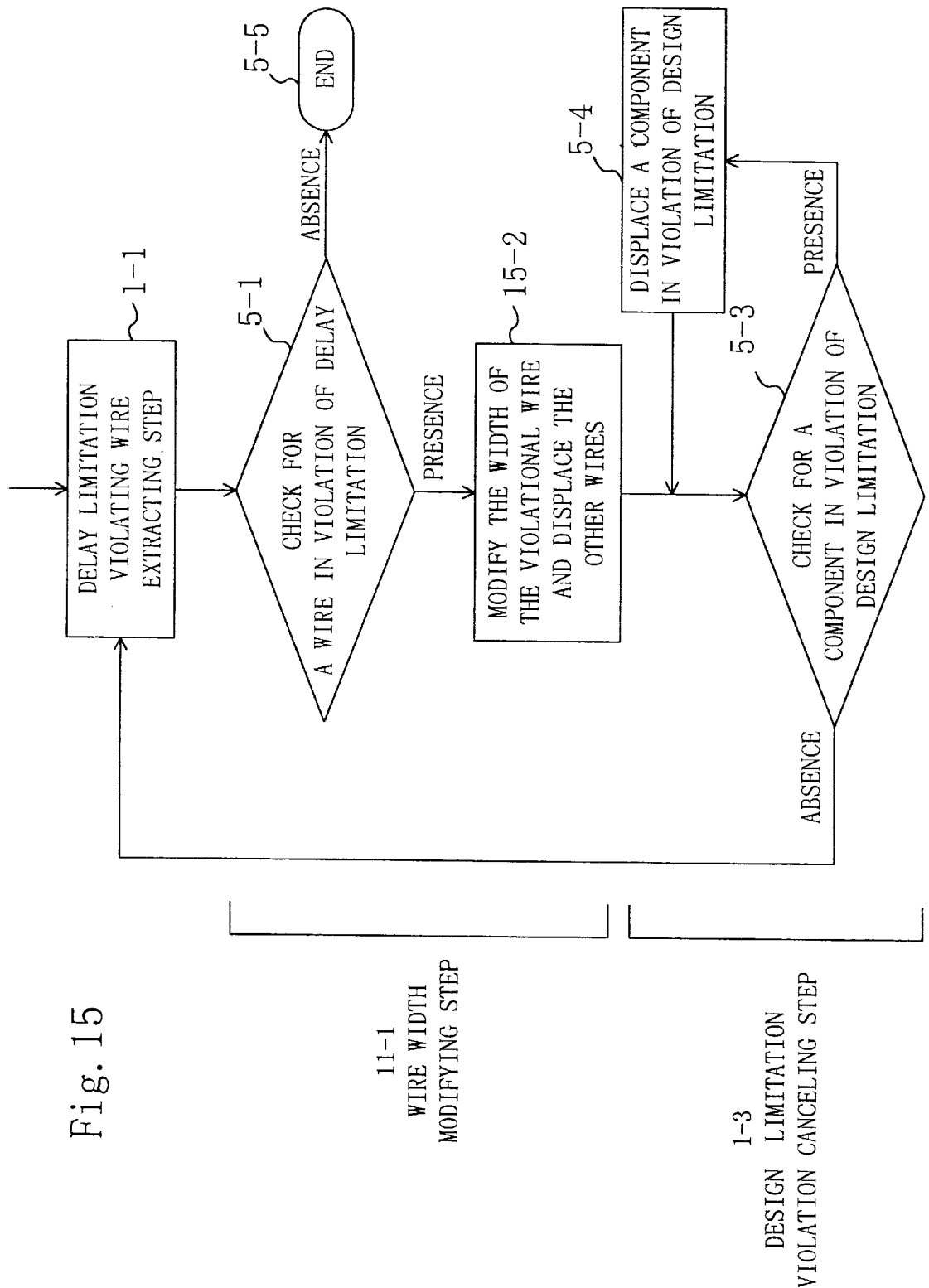
FIG. 15 is a diagram showing in detail a step of modifying the width of a wire and a step of canceling a violation of the design limitation in the second embodiment.

FIG. 15 is a flow chart showing in detail the wire width modifying step 11-1 and the design limitation violation canceling step 1-3. The FIG. 15 flow chart is almost identical with the FIG. 5 flow chart of the first embodiment, with the exception that in step 15-2 of step 11-1 the width of a violational wire involving a violation of the delay limitation is widened to above a predetermined wire width W1, and the remaining other wires are subjected to parallel displacement. Like steps are assigned like step numbers and they are not described accordingly. A required wire width can be found from wire resistance and capacitance.

The processing of the present embodiment is now described below.

Figure 12:
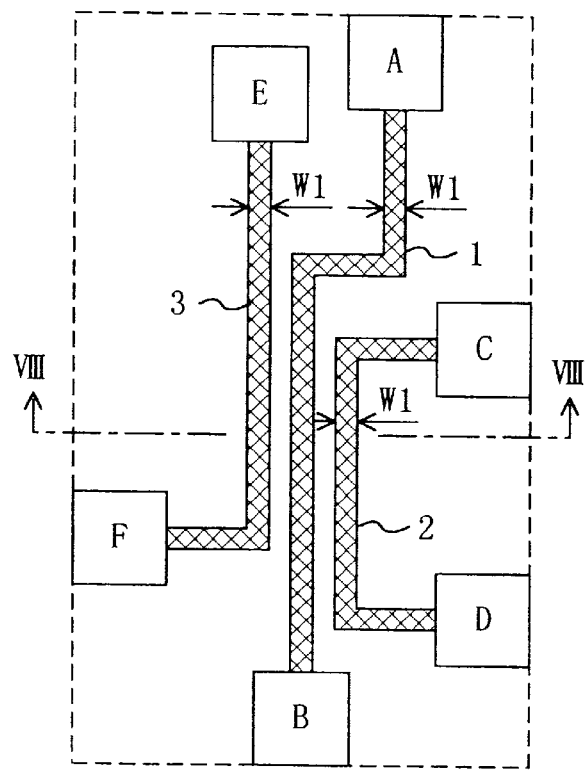
FIG. 12 shows a layout result obtained by a layout steps of the second embodiment.

FIG. 12 is a diagram showing information representing a layout result produced by step 1-0 of the present embodiment. In the present embodiment, there is provided a margin for a predetermined design limitation in order of avoiding an increase in the layout area when there is made a change in the wire width.

Referring to FIG. 12, A–F are components together forming a semiconductor integrated circuit. 1-3 are wires. The wire 1 interconnects the components A and B. The wire 2 interconnects the components C and D. The wire 3 interconnects the components E and F.

Figure 13:
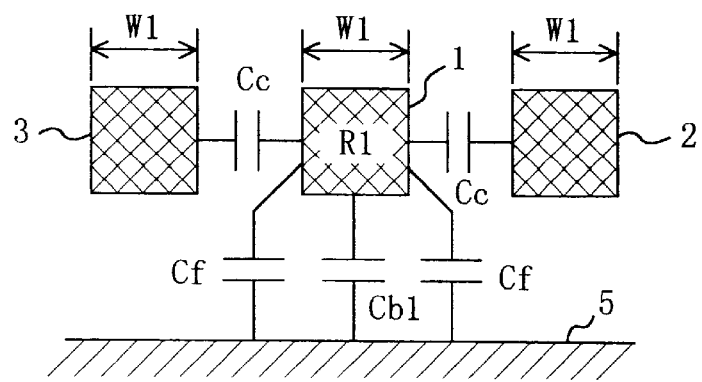
FIG. 13 shows a model diagram showing, in cross section taken along lines XIII—XIII of FIG. 12, the layout result shown in FIG. 12.

FIG. 13 is a model diagram of a cross-sectional view taken along lines XIII—XIII of FIG. 12. 1-3 are wires. 5 is a semiconductor substrate. W1 is the wire width of the wires 1-3. Cc is the interwire capacitance between the wires 1 and 2 (between the wires 1 and 3). Cf is the fringe capacitance of the wire 1. Cb1 is the capacitance between the wire 1 and the semiconductor substrate 5. R1 is the resistance of the wire 1.

The capacitance of the wire 1, C1, is given by:

$$C1=2Cc+2Cf+Cb1$$

The resistance R1 is in inverse proportion to the width W1, and the capacitance Cb1 is in proportion to the width W1. Extending the width W1 does not cause the capacitance Cc and the capacitance Cf to vary. Therefore, if the width W1 is widened, this causes the capacitance Cb1 to increase, as a result of which the capacitance C1 increases while the resistance R1 decreases. A signal propagation delay Delay1 of the wire 1 is in proportion to the product of the resistance R1 and the capacitance C1. The degree that the resistance R1 decreases is greater than the degree that the capacitance Cb1 increases, which therefore makes it possible to achieve a reduction of the delay Delay1. This is expressed as follows.

$$\text{Delay1 } R1 \cdot C1 \; (2Cc+2Cf+a \cdot W1)/W1 \; (2Cc+2Cf)/W1+a$$

a: proportional constant

Figure 14:
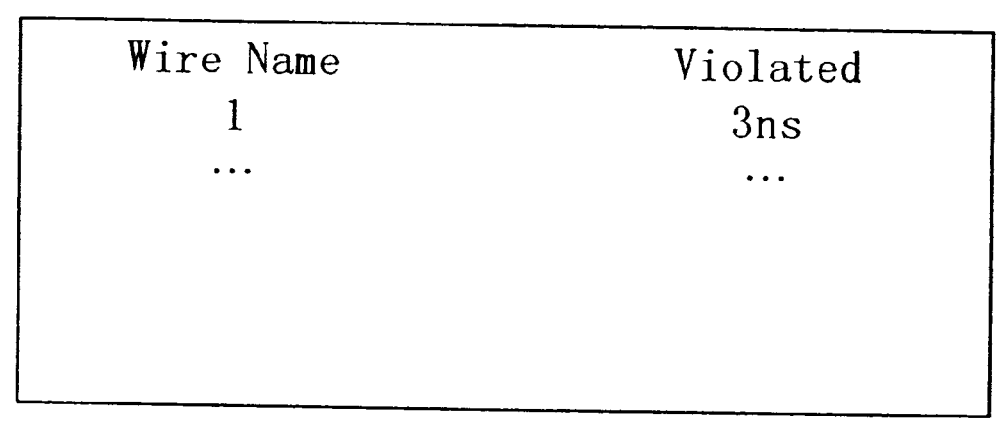

FIG. 14 shows information informing that the wire 1 is extracted as a violational wire involving a violation of the delay limitation in step 1-1.

Figure 16:
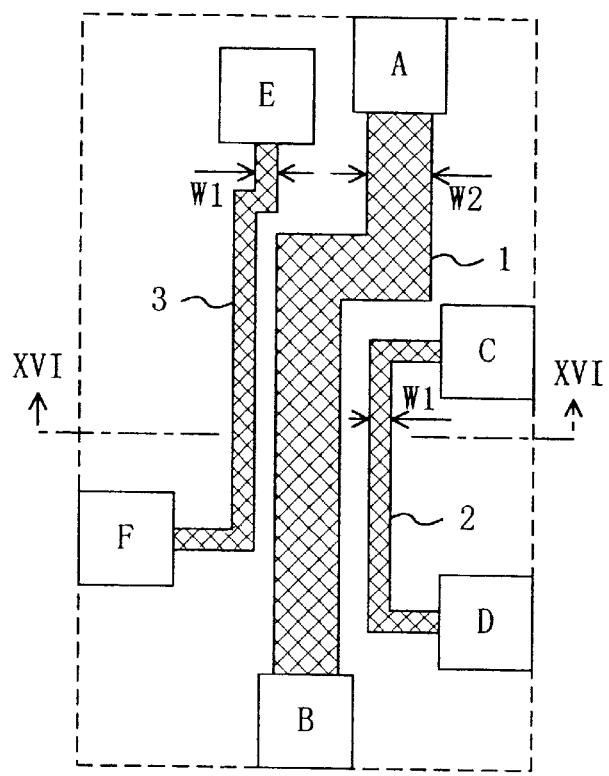
FIG. 16 is a diagram showing a final layout result obtained by the wire width modifying (extending) step of the second embodiment.

FIG. 16 shows a layout result obtained by modifying the wire width of the wire 1 in step 11-1. In comparison with FIG. 12, the wires 2 and 3 are further shifted away from the wire 1.

Figure 17:
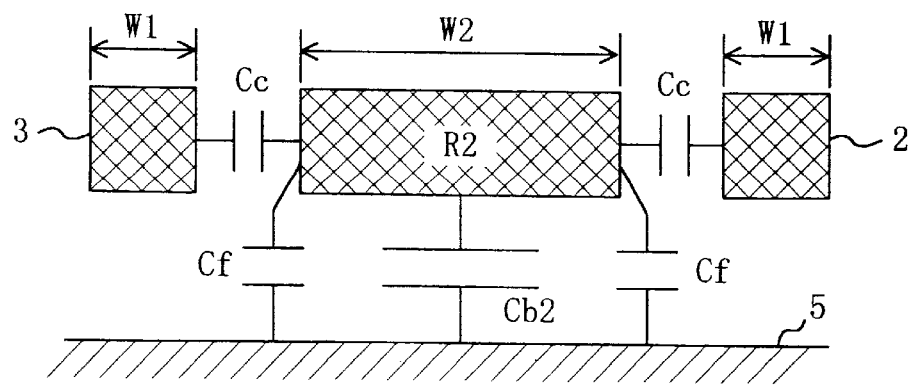
FIG. 17 shows a model diagram showing, in cross section taken along lines XVI—XVI of FIG. 16, the final layout result shown in FIG. 16.

FIG. 17 is a model diagram of a cross-sectional view taken along lines XVI—XVI of FIG. 16. W2 is the width of the wire 1. Cb2 is the capacitance between the substrate and the wire 1. R2 is the resistance of the wire 1. The capacitance of the wire 1, C2, is given by:

$$C2=2Cc+2Cf+Cb2,$$

where Cc is the interwire capacitance, Cf is the fringe capacitance, and Cb2 is the wire/substrate capacitance.

With reference to the wire 1, there is the following relationship between Delay2 (the signal propagation delay of the wire 1) and W2 (the width of the wire 1).

$$\text{Delay2 } R2 \cdot C2 \; (2Cc+2Cf+a \cdot W2)/W2 \; (2Cc+2Cf)/W2+a$$

a: proportional constant

Use of Delay1 and W1 of FIG. 13 gives rise to the following relationship.

$$\text{Delay1}-\text{Delay 2 } (2Cc+2Cf)/W1-(2Cc+2Cf)/W2 \; (1/W1)-(1/W2)$$

This shows that Delay2 decreases more than Delay1 by an amount corresponding to the extension of the width of the wire 1 from W1 to W2.

In the present embodiment, the delay limitation is provided with a margin. Such arrangement makes it possible to cancel violations of the delay limitation without suffering an increase in the layout area, as can be seen from making a comparison between FIG. 16 and FIG. 12.

Next, a modification of the second embodiment is illustrated with reference to FIGS. 18–20. The present modification is a process example when the design limitation is provided with no margins and a semiconductor integrated circuit of minimum layout area is designed.

Figure 18:
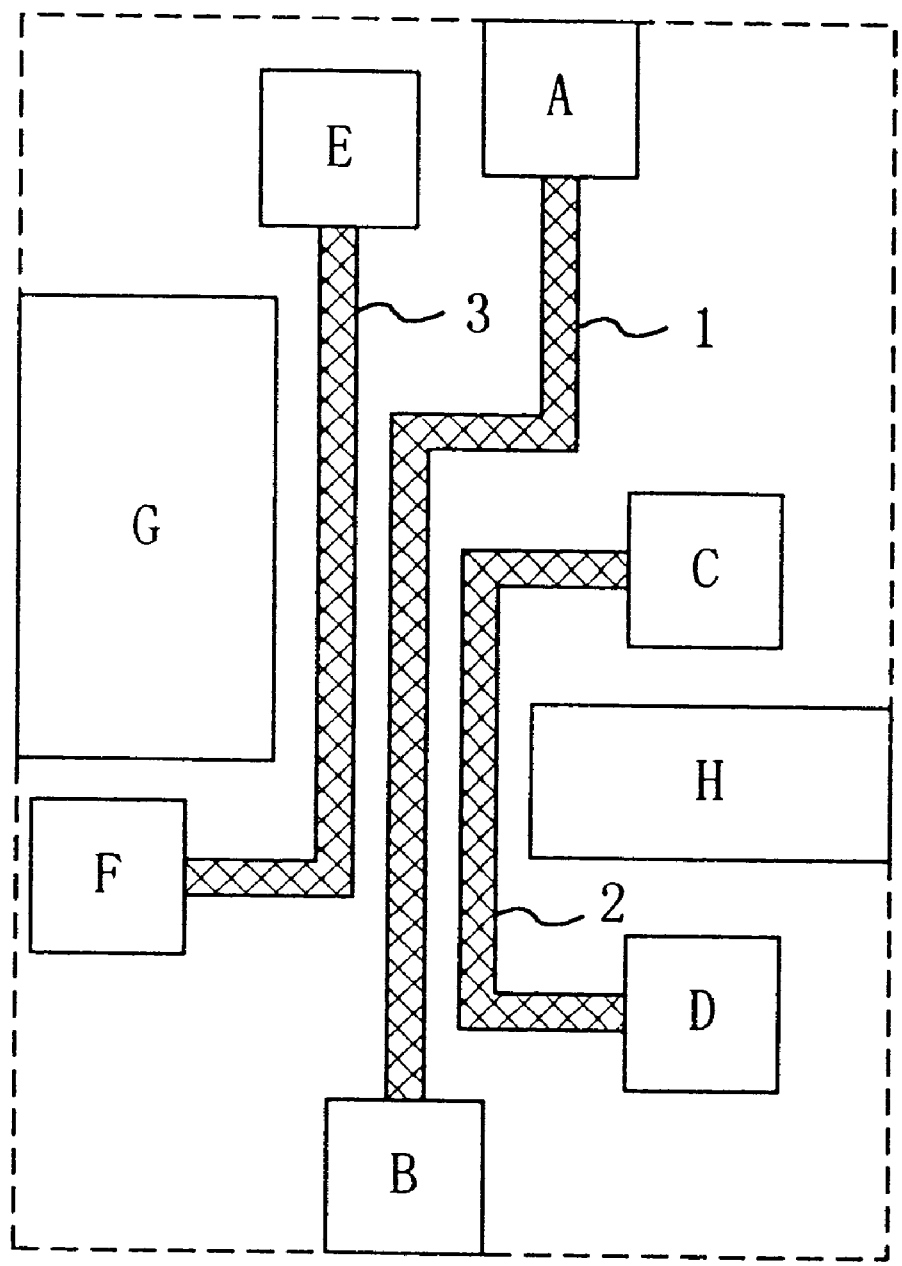
FIG. 18 is a diagram showing a layout result obtained by a layout step of a modification of the second embodiment.

FIG. 18 is information showing a layout result produced in a layout step of the present modification. A–H are components together forming a semiconductor integrated circuit. 1-3 are wires for establishing connections between components.

If the wire 1 is extracted as a violational wire involving a violation of the delay limitation in step 1-1, the width of the wire 1 is increased to W2 in excess of W1 (the predetermined width) and the remaining other wires 2 and 3 are parallelly displaced so as to move away from the wire 1 a distance corresponding to the width (W2–W1).

Figure 19:
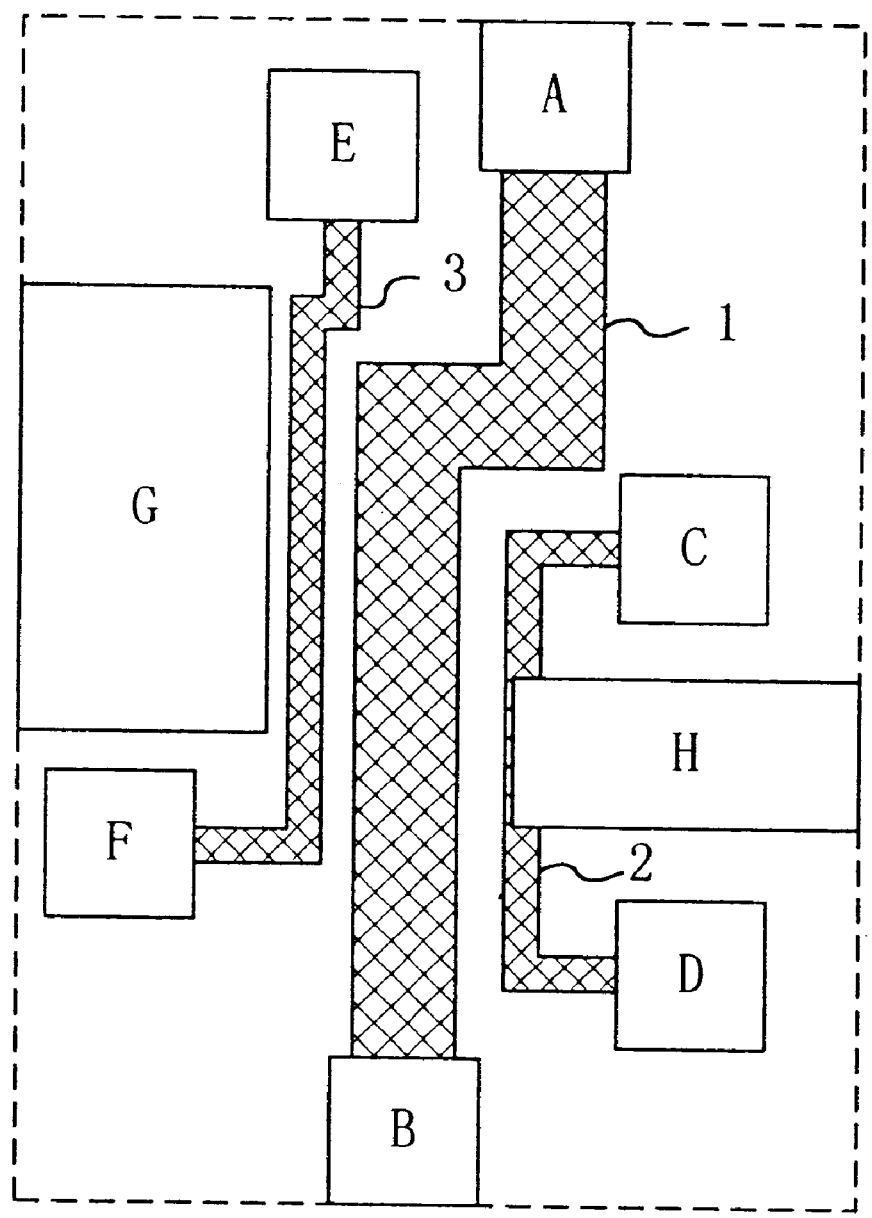
FIG. 19 is a diagram showing a layout result obtained by a wire width modifying (extending) step of the modification of the second embodiment.

Referring now to FIG. 19, both a distance of separation defined between the component H and the wire 2 and a distance of separation defined between the component G and the wire 3 fall below a predetermined distance of separation, in other words violations of the design limitation take place.

Figure 20:
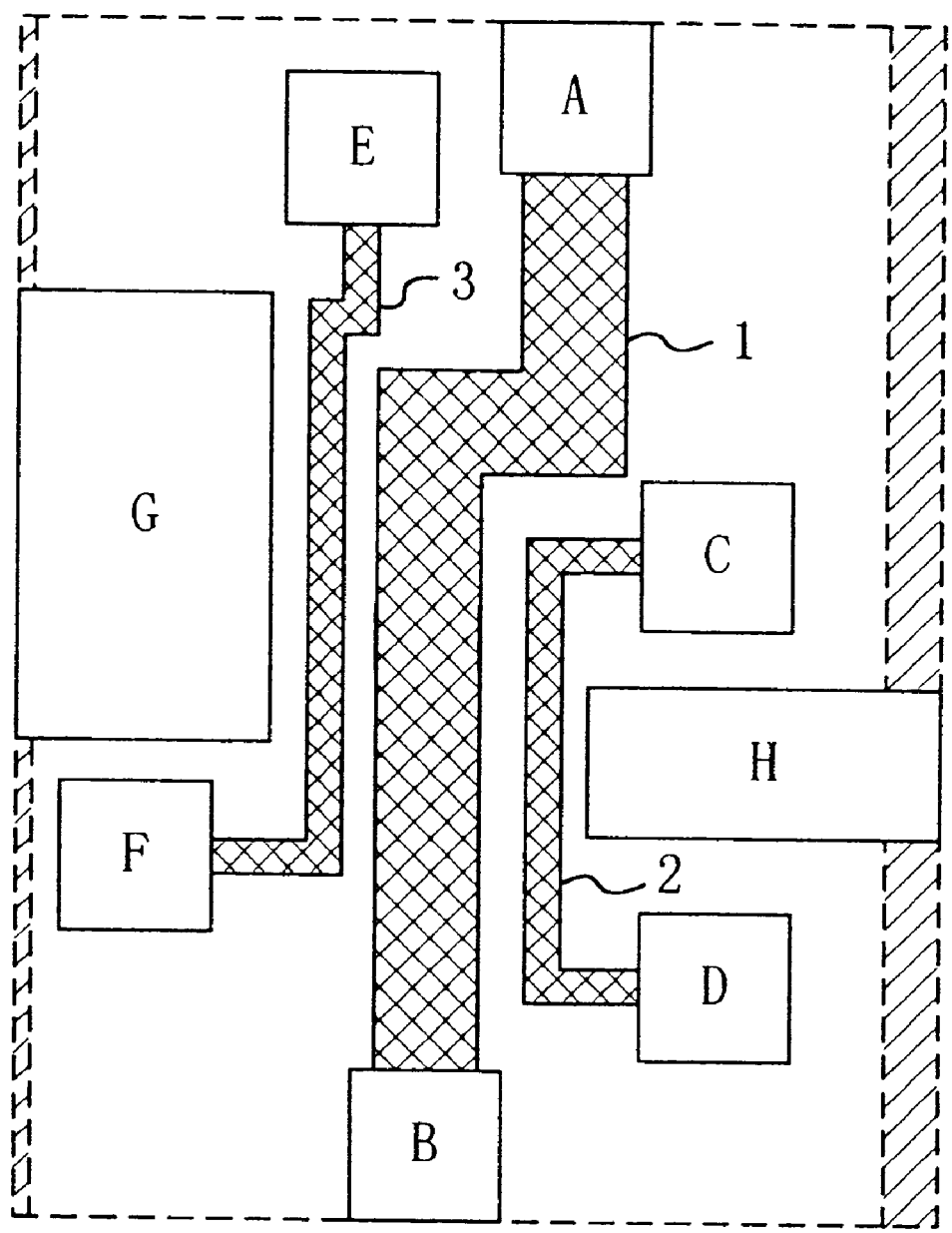
FIG. 20 is a diagram showing a final layout result obtained by displacing a component involving a violation of the design limitation in the modification of the second embodiment.

Next, as shown in FIG. 20, in step 1-3, the violational components G and H are left- and right-shifted, respectively, to cancel the violations.

The area of a layout of the present modification is made to be greater in comparison with the area of a layout of FIG. 18, in order to cancel violations of the design limitation.

Third Embodiment

A third preferred embodiment of the present invention is now described below with reference to FIGS. 21–23. In the present embodiment, violations of the delay limitation are canceled by extending a wire spacing defined between wires while at the same time securing a minimum layout area.

Figure 21:
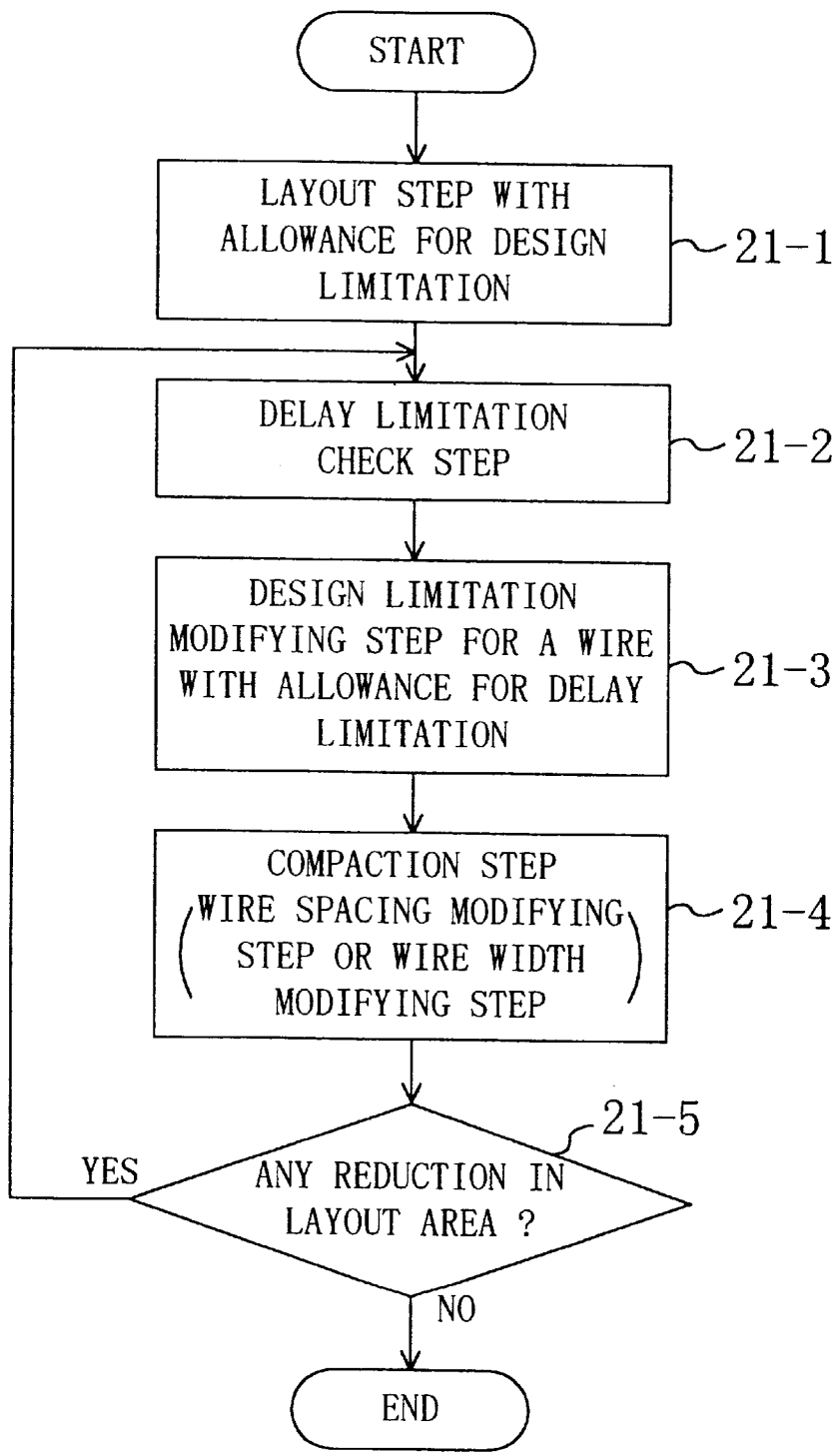
FIG. 21 is a diagram showing steps of a layout method in accordance with a third embodiment of the present invention.

Referring to FIG. 21, a flow of steps of a layout method of the present embodiment is illustrated. This flow chart is formed of a program. This program is an execution program for use in a wiring layout method which is executed by, for example, general-purpose computer and stored in a computer readable recording medium such as floppy disk.

Step 21-1 of FIG. 21 is a layout step of generating a layout on the basis of a design limitation with a margin. The reason of why such a design limitation margin is provided is as follows. The severe (narrow) setting of wire spacing as a predetermined design limitation results in an increase in the capacitance between wires next to each other, therefore leading to an increase in the signal propagation delay time. To cope with this, such a margin is provided so that most of the wires can have a signal propagation delay time falling below the predetermined delay time to meet the design limitation.

Figure 22:
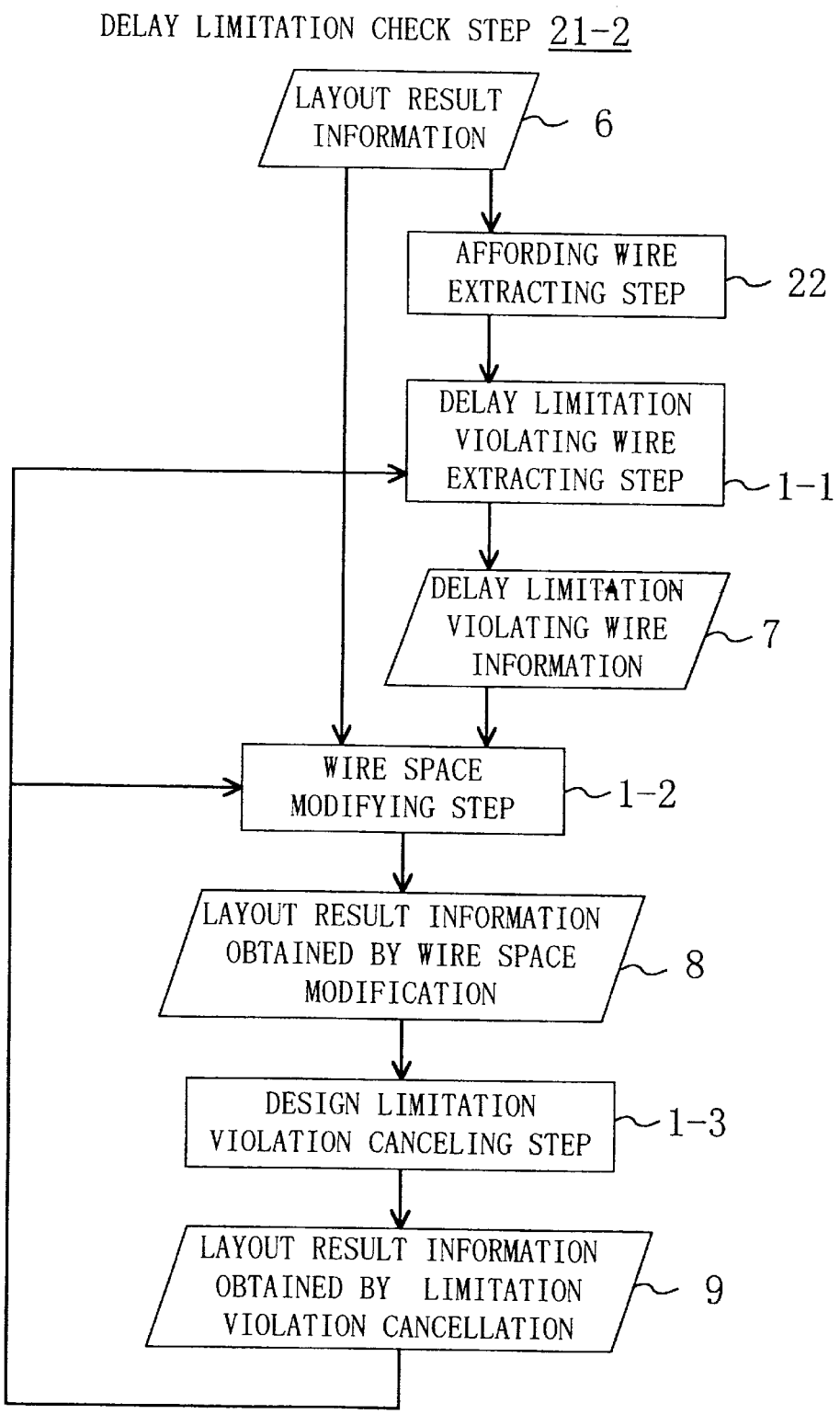
FIG. 22 is a diagram showing in detail a delay limitation check step in the third embodiment.
Figure 23:
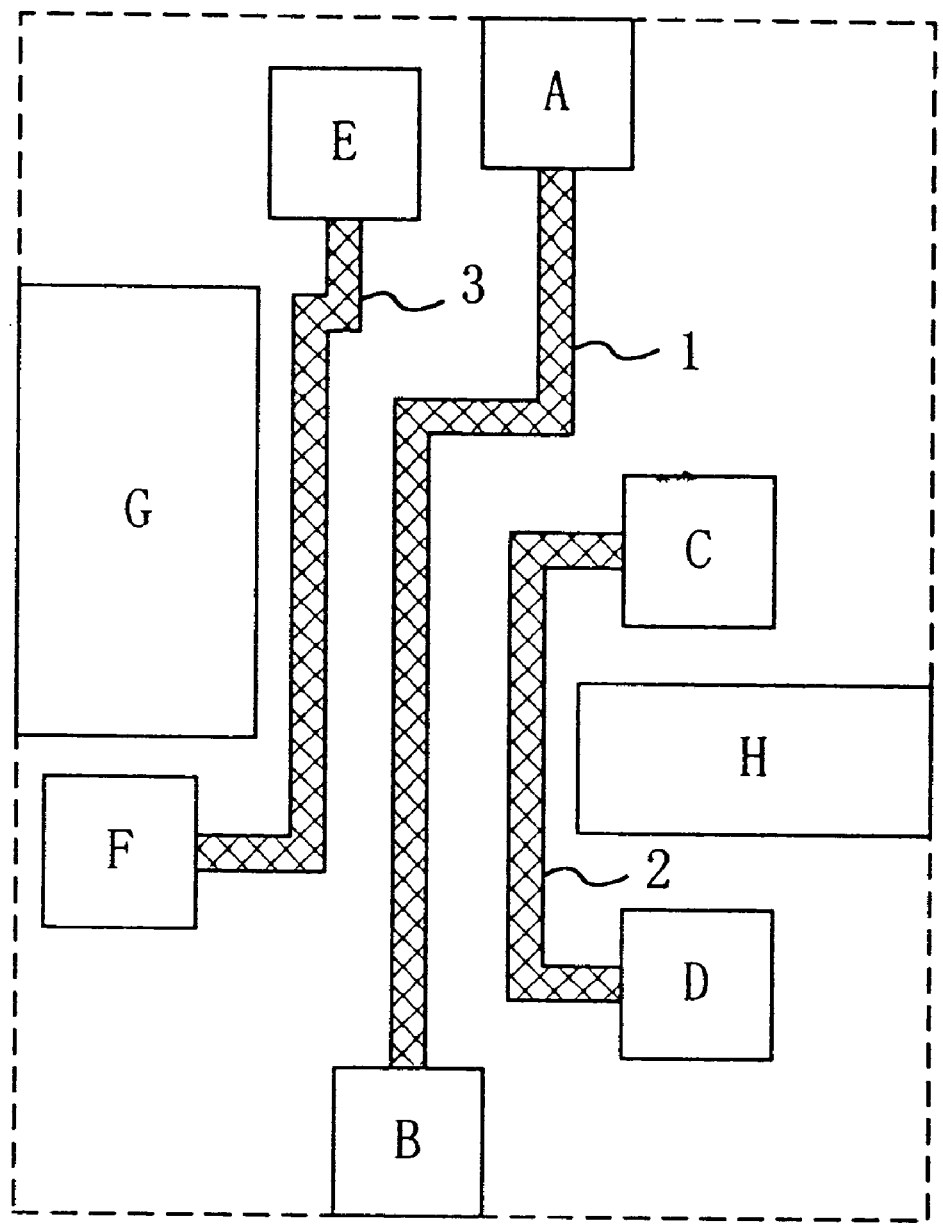
FIG. 23 is a diagram showing a layout result obtained by a layout step of the third embodiment.

Step 21-2 is a check step (a delay judging step) which is illustrated in detail in FIG. 22. In step 21-2, 22 is an extraction step for extracting an affording wire, i.e., a wire with a signal propagation delay time less than the predetermined signal propagation delay time. In step 22, the information 6, which represents an initial layout result produced in step 21-1, is entered. Based on the information 6, a signal propagation delay time for each wire is calculated. Judgement is made to determine whether a calculated signal propagation delay time exceeds the predetermined delay time, that is, whether a calculated signal propagation delay time involves a violation of the predetermined delay time, as a result of which any affording wires with a signal propagation delay time below the predetermined delay time are extracted. Steps 1-1, 1-2, and 1-3 of the present embodiment are identical with the delay limitation violating wire extracting step, with the wire spacing modifying step, and with the design limitation violation canceling step, respectively, and these steps are therefore not described here. Accordingly, in the event that a wire involving a violation of the delay limitation is extracted in step 21-2, the violation is canceled by extending the spacing defined between the violational wire and its adjacent wire, as in the first embodiment.

Referring back to FIG. 21, step 21-3 is a step of increasing the severity of the design limitation imposed on affording wires with allowance for the delay limitation. In step 21-3, according to the degree of margin (e.g., the difference between a signal propagation delay time calculated in step 22 and the predetermined delay time), the predetermined wire spacing or the predetermined wire width (the design limitation) is reduced for each affording wire.

Figure 24:
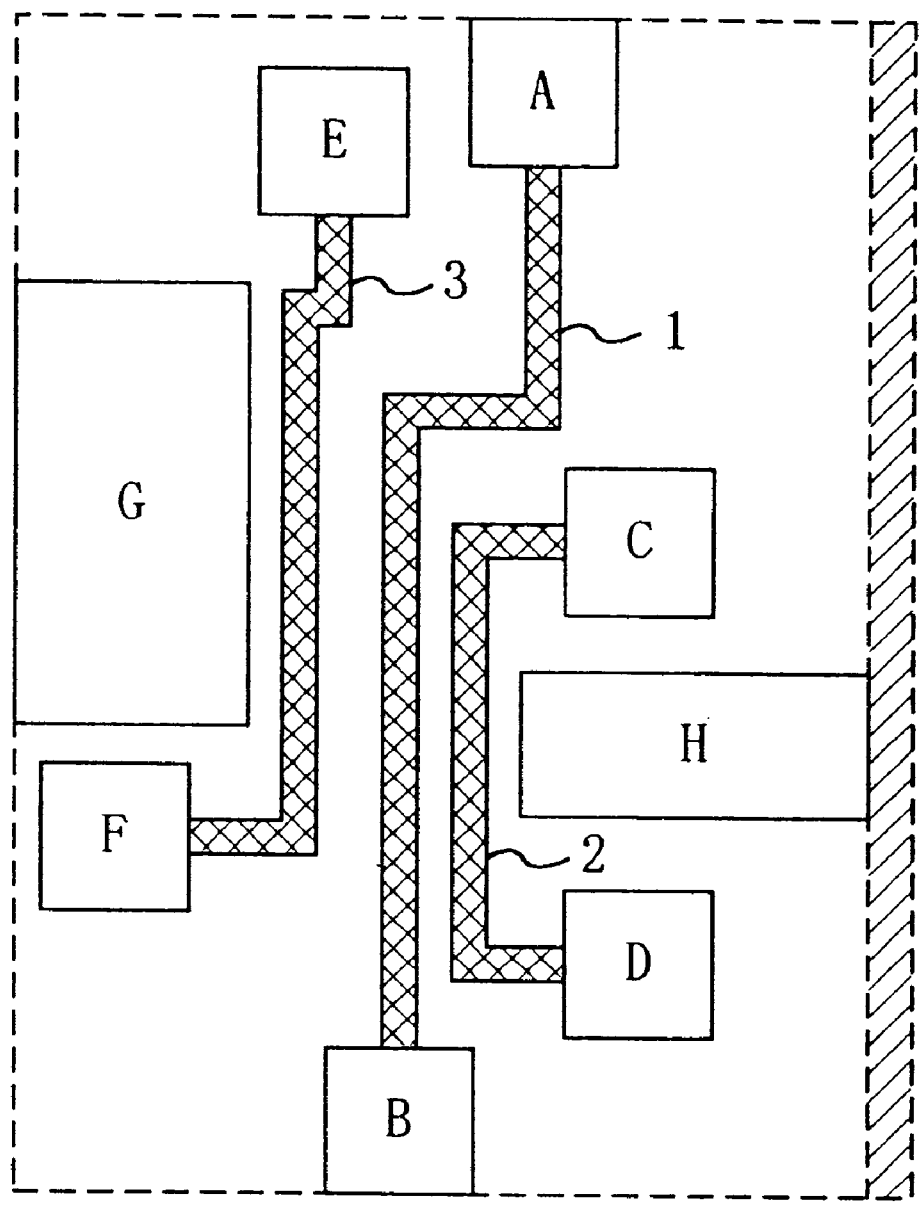
FIG. 24 is a diagram showing a final layout result obtained by compaction of the third embodiment.

Step 21-4 is a compaction step. In step 21-4, based on the modified wire spacing and the modified wire width, the wire spacing between the affording wire and its adjacent wire is reduced and the width of the affording wire is reduced, in order to achieve a reduction of the layout area. Suppose that an initial layout result is the one shown in FIG. 23. In this case, if the wire spacing, defined between the wires 1 and 2, falls below the predetermined wire spacing, the predetermined wire spacing is reduced and the wire spacing between the wires 11 and 2 is changed to the reduced predetermined wire spacing as shown in FIG. 24. A final layout result of FIG. 24 shows that there is achieved a reduction of the layout area within a hatched range.

Step 21-5 is a judging step. Step 21-5 determines whether a reduction of the layout area is achieved by step 21-4. If the layout area is reduced, the layout program returns to step 21-2 and steps following step 21-2 are repeated. When the layout area is no longer reduced, the layout program is completed.

In accordance with the present embodiment, a wire spacing for a wire involving a violation of the delay limitation is extended while on the other hand a wire spacing for an affording wire is reduced, which makes it possible to provide a layout of minimum area while at the same time meeting the delay limitation.

In the present embodiment, in the presence of a wire involving a violation of the delay limitation, such a delay limitation violation is canceled by the extension of wire spacing. However, the violation of the delay limitation may be canceled by extending the width of a violational wire, as in the second embodiment.

The invention claimed is:

1. A method for the layout of a semiconductor integrated circuit, said layout method comprising:
   (a) a layout step of laying out, in conformance with a predetermined design limitation, wires for interconnecting components which together form a circuit;
   (b) a delay judging step of checking, on the basis of information representing a layout result obtained in said layout step, each of said laid-out wires for the presence of a violation of a predetermined delay limitation for the limitation of a signal propagation delay time; and
   (c) a design limitation modifying step of calculating an amount of change to be made in said predetermined design limitation based on a result of said judging step and making a change in said predetermined design limitation based on said calculated amount of change and said layout result information,
   wherein said delay judging step (b) includes a delay limitation violating wire extracting step (b-1) of extracting, from among said laid-out wires, a violational wire in violation of said predetermined delay limitation,
   wherein said design limitation modifying step (c) includes a delay limitation violation canceling step (c-1) including:
      (c-1-1) calculating an amount of change to be made in said predetermined design limitation imposed on said violational wire based on an amount of violation of said predetermined delay limitation caused by said extracted violational wire, said amount of violation being a time by which a signal propagation delay time on the violational wire exceeds said signal propagation delay time defined by said predetermined delay limitation; and
      (c-1-2) making a change in said design limitation imposed on said violational wire based on said amount of violation, to cancel said delay limitation violation caused by said violational wire, and
   wherein said layout method further comprises a design limitation violation canceling step (d) including (d-1) receiving layout information representing a result of modification of said predetermined design limitation in said step (c); and (d-2) when a distance of separation defined between said violational wire as re-laid out so as to meet said modified design limitation and a component laid out so as to meet said predetermined design limitation, does not meet a design limitation imposed on said distance of separation, displacing said component to meet said design limitation.

2. The layout method according to claim 1, wherein:
   a wire spacing defined between two adjacent wires is predetermined to serve as said design limitation; and
   said delay limitation violation canceling step includes a wire spacing modifying step of subjecting a wire located next to said extracted wire in violation of said delay limitation to parallel displacement in order to extend a wire spacing defined between said violational wire and said adjacent wire to above said predetermined wire spacing.

3. The layout method according to claim 1 wherein said layout method returns to said delay limitation violating wire extracting step (b-1) upon completion of said design limitation violation canceling step (d) to repeat said steps (b-1) and (d) thereafter.

4. The layout method according to claim 1 wherein:
   a wire width is predetermined to serve as said design limitation; and
   said delay limitation violation canceling step includes a wire width modifying step of extending, based on said layout result information and said information about said violational wire, the width of said violational wire and parallelly displacing the remaining other wires a distance equal to said extended width.

5. The layout method according to claim 4 wherein said layout method returns to said delay limitation violating wire extracting step (b-1) upon completion of said design limitation violation canceling step (d) to repeat said steps (b-1) and (d) thereafter.

6. The layout method according to claim 1, said layout step laying out said wires on the basis of a predetermined design limitation with such allowance for most of said laid-out wires to meet said predetermined delay limitation;

said delay judging step including a non-violational wire extracting step of extracting, from among said laid-out wires, a non-violational wire having a signal propagation delay time which meets said predetermined delay limitation; and said design limitation modifying step including:

a design limitation changing step of increasing the severity of said predetermined design limitation imposed on said extracted non-violational wire; and a compaction step of modifying, based on said modified design limitation, a layout around said non-violational wire in order to achieve a reduction in layout area.

7. The layout method according to claim 6, wherein said layout method returns to said non-violational wire extracting step upon completion of said compaction step to repeat said non-violational extracting and compaction steps thereafter.

8. The layout method according to claim 6
wherein:

a wire spacing defined between two adjacent wires is predetermined to serve as said design limitation; and said compaction step includes a wire spacing modifying step of subjecting a wire located next to said extracted non-violational wire to parallel displacement in order to reduce a wire spacing defined between said non-violational wire and said adjacent wire to below said predetermined wire spacing.

9. The layout method according to claim 6,
wherein:

a wire width is predetermined to serve as said design limitation; and said compaction step includes a wire width modifying step of reducing the width of said non-violational wire and parallelly displacing remaining other wires a distance equal to said reduced width.

10. A recording medium with a record containing a semiconductor integrated circuit layout execution program for a computer to generate a layout of a semiconductor integrated circuit, said layout execution program including:

(a) laying out, in conformance with a predetermined design limitation, wires including non-clock wires for interconnecting components which together form a circuit;

(b) checking, on the basis of information representing a layout result obtained in said laying out step, each of said wires including said non-clock wires for the presence of a violation of a predetermined delay limitation for the limitation of a signal propagation delay time; and (c) automatically making a change in said predetermined design limitation on the basis of said information representing a layout result and a result of said checking step.

11. The recording medium according to claim 10,
wherein:

a violational wire in violation of said predetermined delay limitation is extracted from among said wires on the basis of said checking step an amount of change to be made in said predetermined design limitation imposed on said violational wire is calculated based on an amount of violation of said predetermined delay limitation caused by said extracted violational wire, said amount of violation being a time by which a signal propagation delay time on the violational wire exceeds said signal propagation delay time defined by said predetermined delay limitation; and a change is made in said predetermined design limitation imposed on said violational wire based on said calculated amount of change to be made in said predetermined design limitation imposed on said violational wire, thereby canceling said violation of said predetermined delay limitation.

12. The recording medium according to claim 11,
wherein:

said layout execution program predefines a wire spacing defined between two adjacent wires as said design limitation; and said delay limitation violation cancellation is carried out by subjecting a wire located next to said extracted wire in violation of said delay limitation to parallel displacement in order to extend a wire spacing defined between said violational wire and said adjacent wire to above said predetermined wire spacing.

13. The recording medium according to claim 11,
wherein:

said layout execution program predefines a wire width as said design limitation; and said delay limitation violation cancellation is carried out by extending the width of said violational wire and parallelly displacing the remaining other wires a distance equal to said extended width.

14. The recording medium according to claim 10,
wherein:

said wires are laid out on the basis of a predetermined design limitation with such allowance for most of said laid-out wires to meet said predetermined delay limitation;

after said checking step, a non-violational wire having a signal propagation delay time which meets said predetermined delay limitation is extracted from among said laid-out wires on the basis of said judgement; and said change in said predetermined design limitation increases the severity of said predetermined design limitation imposed on said extracted non-violational wire; and after said change is made, a layout around said non-violational wire is modified based on said changed design limitation in order to achieve a reduction in layout area.

15. The recording medium according to claim 14,
wherein:

a wire spacing defined between two adjacent wires is predetermined to serve as said design limitation; and said reduction in layout area includes subjecting a wire located next to said extracted non-violational wire to parallel displacement in order to modify a wire spacing defined between said non-violational wire and said adjacent wire to below said predetermined wire spacing.

16. The recording medium according to claim 14,
wherein:

a wire width is predetermined to serve as said design limitation; and said reduction in layout area includes reducing the width of said non-violational wire and parallelly displacing the remaining other wires a distance equal to said reduced width of said non-violational wire for wire width modification.

17. A semiconductor integrated circuit comprising a plurality of components together forming a circuit which are connected together by wires, wherein:

said wires includes at least one wire and remaining wires other than said at least one wire, said remaining wires having an identical design limitation imposed thereon, and said at least one wire violating a predetermined delay limitation when said identical design limitation is imposed on said at least one wire, said at least one wire having a different design limitation than said identical design limitation automatically imposed thereon so as not to violate said predetermined delay limitation.

18. The semiconductor integrated circuit according to claim 17, wherein:

a wire spacing defined between two adjacent wires is predetermined to serve as said design limitation; and a greater wire spacing than said predetermined wire spacing is set between said two adjacent wires.

19. The semiconductor integrated circuit according to claim 17, wherein:

a wire width is predetermined to serve as said design limitation; and said at least one wire is set having a greater wire width than said predetermined wire width.

20. A recording medium with a record containing a semiconductor integrated circuit layout execution program for a computer to generate a layout of a semiconductor integrated circuit, said layout execution program including:

(a) laying out, in conformance with a predetermined design limitation, all wires including non-clock wires for interconnecting components which together form a circuit;

(b) checking, on the basis of information representing a layout result obtained in said laying out step, each of said wires including said non-clock wires for the presence of a violation of a predetermined delay limitation for the limitation of a signal propagation delay time; and (c) calculating an amount of change to be made in said predetermined design limitation based on a result of the checking, to make a change in said predetermined design limitation based on said calculated amount of change and said layout result information.

21. A method for the layout of a semiconductor integrated circuit, said layout method comprising:

(a) a layout step of laying out, in conformance with a predetermined design limitation, wires including non-clock wires for interconnecting components which together form a circuit:

(b) a delay judging step of checking, on the basis of information representing a layout result obtained in said layout step, each of said laid-out wires including said non-clock wires for the presence of a violation of a predetermined delay limitation for the limitation of a signal propagation delay time; and (c) a design limitation modifying step of calculating an amount of change to be made in said predetermined design limitation based on a result of said judging step and making a change in said predetermined design limitation based on said calculated amount of change and said layout result information.

* * * * *

UNITED STATES PATENT AND TRADEMARK OFFICE
CERTIFICATE OF CORRECTION

PATENT NO. : 6,202,195 B1
DATED : March 13, 2001
INVENTOR(S) : Masakazu Tanaka et al.

It is certified that error appears in the above-identified patent and that said Letters Patent is hereby corrected as shown below:

<u>Title page,</u>
After "(*) Notice:" insert -- This patent issued on a continued prosecution application filed under 37 CFR 1.53(d), and is subject to the twenty year patent term provision of 35 U.S.C. 154(a)(2). --.

Signed and Sealed this

Twenty-fifth Day of December, 2001

Attest:

Attesting Officer

JAMES E. ROGAN
Director of the United States Patent and Trademark Office